(12) United States Patent
Felber

(10) Patent No.: US 7,760,893 B1
(45) Date of Patent: Jul. 20, 2010

(54) AUTOMATIC VOLUME CONTROL TO COMPENSATE FOR SPEECH INTERFERENCE NOISE

(75) Inventor: Franklin S. Felber, San Diego, CA (US)

(73) Assignee: Starmark, Inc., San Diego, CA (US)

( * ) Notice: Subject to any disclaimer, the term of this patent is extended or adjusted under 35 U.S.C. 154(b) by 1028 days.

(21) Appl. No.: 11/460,246

(22) Filed: Jul. 26, 2006

(51) Int. Cl.
  *H03G 3/00* (2006.01)
  *H03G 3/20* (2006.01)

(52) U.S. Cl. .......................... 381/104; 381/107; 381/57

(58) Field of Classification Search ................. 381/104, 381/107, 108, 109, 56, 57, 97, 94.1, 94.7, 381/71.1, 71.4, 71.12, 120
See application file for complete search history.

(56) References Cited

U.S. PATENT DOCUMENTS

| 4,045,748 | A | | 8/1977 | Filliman |
| 4,306,115 | A | | 12/1981 | Humphrey |
| 4,476,571 | A | | 10/1984 | Tokumo et al. |
| 4,479,237 | A | | 10/1984 | Sugasawa |
| 4,553,257 | A | | 11/1985 | Mori et al. |
| 4,628,526 | A | | 12/1986 | Germer |
| 4,864,246 | A | | 9/1989 | Kato et al. |
| 4,933,987 | A | | 6/1990 | Parks |
| 5,027,432 | A | | 6/1991 | Skala et al. |
| 5,081,682 | A | | 1/1992 | Kato et al. |
| 5,450,494 | A | | 9/1995 | Okubo et al. |
| 5,509,081 | A | | 4/1996 | Kusama |
| 5,666,426 | A | | 9/1997 | Helms |
| 5,668,744 | A | * | 9/1997 | Varadan et al. ............. 700/280 |
| 5,706,354 | A | * | 1/1998 | Stroehlein ................... 381/94.1 |
| 6,700,441 | B1 | * | 3/2004 | Zhang et al. ................... 330/52 |
| 6,868,162 | B1 | | 3/2005 | Jubien et al. |
| 2004/0047480 | A1 | | 3/2004 | Roeck et al. |
| 2004/0076302 | A1 | | 4/2004 | Christoph |
| 2005/0163331 | A1 | | 7/2005 | Gao et al. |
| 2007/0003078 | A1 | * | 1/2007 | Escott et al. ................. 381/107 |
| 2007/0121979 | A1 | | 5/2007 | Zhu et al. |
| 2007/0291959 | A1 | * | 12/2007 | Seefeldt ....................... 381/104 |

\* cited by examiner

*Primary Examiner*—Curtis Kuntz
*Assistant Examiner*—Hai Phan
(74) *Attorney, Agent, or Firm*—Lewis Kohn & Fitzwilliam LLP; Timothy Fitzwilliam

(57) ABSTRACT

A microphone detects acoustic waves from speakers and background noise, and produces a corresponding signal that is digitized; also digitized is a desired audio signal; the two digitized signals are phase and amplitude correlated; a subtractor finds the difference between the correlated microphone and audio signals; a transform process produces over a time period a signal corresponding to the amplitude of each frequency component of the difference signal; from the transform process a bandpass filter passes only frequency components within selected bands; a speech interference noise level calculator calculates a combination of the amplitudes of the bandpass filtered frequency components; and a solver uses the combination to produce, according to an algorithm, a signal for controlling the gain of an audio amplifier.

29 Claims, 3 Drawing Sheets

AUTOMATIC VOLUME CONTROL TO COMPENSATE FOR SPEECH INTERFERENCE NOISE

The invention relates generally to audio systems and, more particularly, to a system and method for automatically adjusting the volume of an audio device to compensate only for noise that interferes with the intelligibility of speech or appreciation of music from said audio device.

BACKGROUND OF THE INVENTION

The automatic volume control (AVC) of this invention is a fully automatic system and method for adjusting the volume of an audio output device, such as a car radio, in accordance with listener preferences, to compensate selectively for changing levels of ambient noise only in the time and frequency domains that interfere with intelligibility of speech or appreciation of music.

An example of an audio device is a car radio. Many sources of noise can interfere with hearing a car radio, including tire (road) noise, wind, engine noise, traffic (highway) noise, the fan of a heater or air conditioner, and noises made by the driver and passengers. The noise levels of all of these sources can change with time, depending on factors like the speed of the car or changing environmental conditions outside or inside the car. The noise levels can change abruptly or quasi-continuously or can be transient. Having repeatedly to manually adjust the volume of an audio device to compensate for changing noise levels is a nuisance, and, in a car, can compromise the safety of the occupants and others.

Not all noise, however, interferes with a listener's understanding or appreciation of the output of an audio device. And not all noise, therefore, would impel a listener to want to change the volume. For example, nearly all the information in speech is contained within the frequency interval 200 Hz to 6 kHz [L. E. Kinsler et al., Fundamentals of Acoustics, Third Ed. (John Wiley & Sons, NY, 1982), p. 283]. Generally, only the frequency components of noise within this interval can detract significantly from intelligibility of speech. Similarly, the intelligibility of full sentences in noise environments is substantially greater than the intelligibility of isolated words. Generally, only noises that persist long enough to mask more than a few words can detract significantly from intelligibility of speech.

Any system that attempts to compensate for all noise, regardless of frequency or duration, will generally overcompensate by raising or lowering the volume of an audio device to adjust for noise that is not significantly interfering with the ability to listen to the audio device. For example, the occurrence of a high-pitched whine above 6 kHz should not generally be cause for the volume of an audio device to be increased automatically, or to be decreased upon its cessation. Similarly, a transient shout within a car, or another car passing at high speed in the opposite direction, should not generally be cause for the volume to be changed.

What is needed, therefore, is not a means for automatically adjusting the volume of an audio device to compensate for changes in all ambient noise, but rather only that noise of a frequency and duration that detracts from the ability to listen to the audio device. That is, the AVC should have some means of discriminating significant noise, which persistently detracts from listening ability, from noise that is less consequential. One means of identifying such significant noise is to measure its interference with the intelligibility of speech. One measure of interference with intelligibility considered suitable for field use is the preferred speech interference level (PSIL), which is the arithmetic average of the noise levels in the three octave bands centered at 500, 1000, and 2000 Hz [ibid., p. 284].

To be fully automatic, an AVC should impose no need for additional manual controls on an audio device, other than possibly an on-off switch for the AVC feature. Listener preferences for volume should be established through normal operation of the audio device and a minimum of manual volume adjustments. The two key listener preferences that should be automatically registered by an AVC are the preferred signal-to-noise ratio and the preferred signal floor. The relevant signal-to-noise ratio is the ratio of the amplifier gain of an audio device to a suitable measure of significant noise, such as the PSIL. The preferred signal floor is the lowest amplifier gain acceptable to the listener, independent of how quiet the environment may be.

SUMMARY OF THE INVENTION

For an audio amplifier providing an audio signal to one or more speakers, this invention provides an automatic volume control to compensate for speech interference noise including: a microphone for detecting acoustic waves emanating from the one or more speakers and background noise, and in response for producing a corresponding signal; a phase correlator process for phase correlating the microphone and audio signals; an amplitude correlator process for amplitude correlating the phase correlated microphone and audio signals; a subtraction process for producing a signal corresponding to a difference between the phase and amplitude correlated microphone and audio signals; a transform process for producing over a period of time a signal corresponding to the amplitude of each frequency component of the difference signal within the spectrum of said transform process; a bandpass filter process for filtering the transform process produced signal to pass only those frequency components within selected bands; a speech-interference level calculation process for receiving the bandpass filtered frequency components and responsive to produce a signal corresponding to a combination of the amplitudes of the bandpass filtered frequency components; and a solver process for receiving the combined signal and responsive to produce according to an algorithm a signal for controlling the gain of the audio amplifier. Preferably the selected bands include the three octave bands centered at 500, 1000 and 2000 Hz. Preferably the transform process comprises a fast Fourier transform module. Preferably the combination of the amplitudes of the bandpass filtered frequency components is an arithmetic average of the noise levels in the octave bands. Preferably some or all the processes, algorithms and filtering are performed in and by a digital signal processor that receives both the digitized microphone signal and the digitized audio signal.

DESCRIPTION OF THE PREFERRED EMBODIMENT

Figure 1:
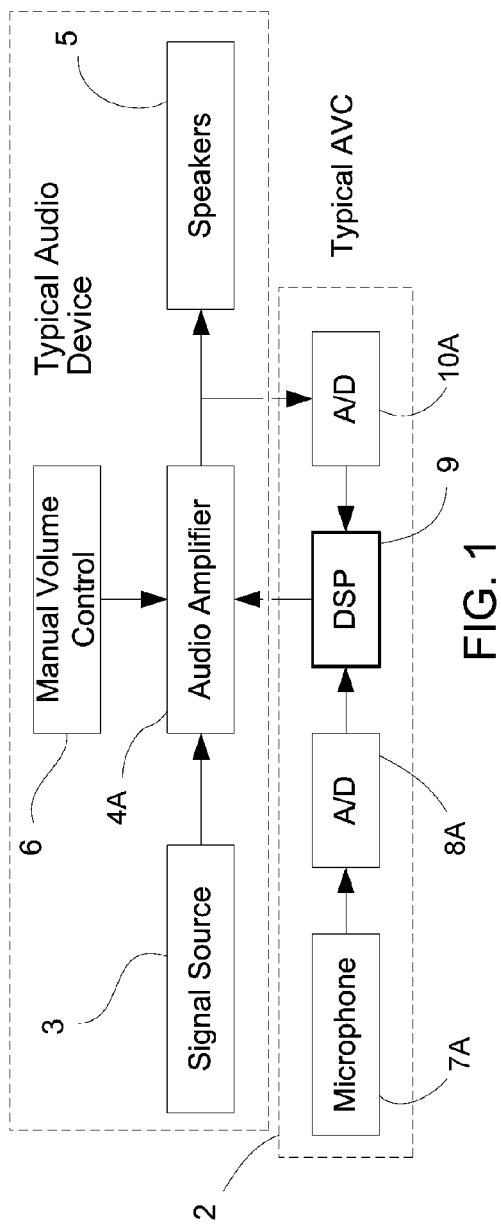
FIG. 1 is a functional block diagram of the main components of a conventional audio device, primarily the amplifier stage that precedes a set of speakers, and a conventional AVC for controlling the amplifier stage.

Referring to FIG. 1, illustrated in general are the main components of a conventional audio device having a conventional automatic volume control (AVC) 2. Since this invention presents a novel AVC, the components of the conventional audio device preceding its amplifier stage 4A are not shown individually, but are generally represented by a function entitled "Signal Source" 3. In a conventional audio device, the signal source 3 provides an electrical signal that is amplified by an audio amplifier 4A for driving a set of speakers 5. The speakers convert the amplified signal to an acoustic wave signal that can be transmitted to listeners. Generally, the acoustic wave volume of such a conventional audio device is controlled by a manual volume control 6 that adjusts the gain of the audio amplifier 4A. The microphone 7A receives both the transmitted acoustic waves from the speakers 5 and any background noise. The microphone transduces the acoustic waves to a corresponding analog electrical signal that is communicated to an analog-to-digital (A/D) converter 8A wherein the analog signal is converted to a corresponding digital signal that is communicated to a digital signal processor (DSP) 9 for processing. Concurrently, the amplified electrical signal from the audio amplifier is converted by an A/D converter 10A to a corresponding digital signal that is also communicated to the DSP 9. After comparing the signals from the microphone 7A and the audio amplifier 4A, the DSP automatically performs a process that results in a control signal that is communicated to the audio amplifier 4A to adjust the gain of the amplifier and, thereby, the volume of the speakers 5.

As described thus far, the automatic control of the volume of the audio device by the AVC 2 is within the state of the art. FIG. 1 is essentially the same as FIG. 1 of Helms, U.S. Pat. No. 5,666,426. The innovations and claims of this invention relate to the components and functions of a novel DSP 35 and the interface signals to and from the DSP, shown in FIG. 2.

Figure 2:
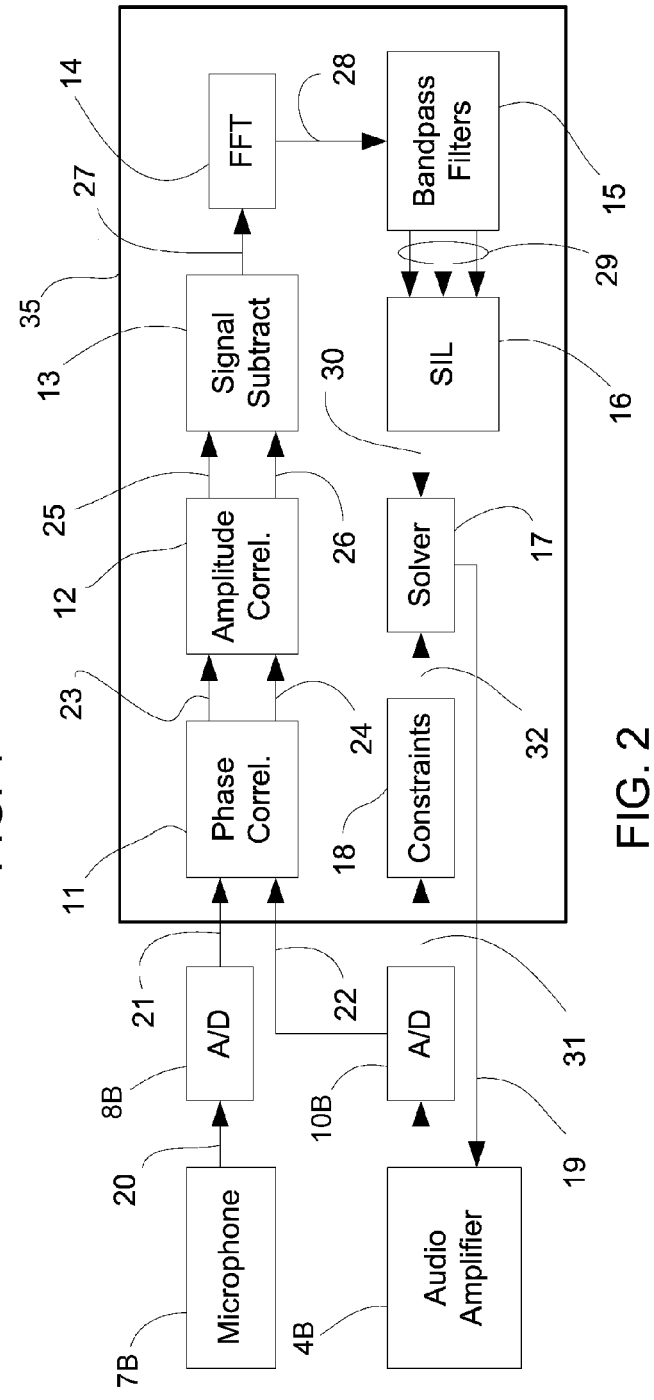
FIG. 2 is a functional block diagram illustrating a novel digital signal processor (DSP) (the functions within the thick-lined block 35) of a preferred embodiment of an AVC according to this invention, and the DSP's interfaces with the rest of the AVC and with an audio amplifier of an audio device.

Referring to FIG. 2, a novel AVC is illustrated to incorporate a novel DSP 35 that includes a phase correlator 11, an amplitude correlator 12, a signal subtraction module 13, a Fast Fourier Transform (FFT) module 14, bandpass filters 15, a speech-interference noise level (SIL) calculator 16, a solver 17, and a module 18 to constrain a control signal 19 from the solver 17 to an audio amplifier 4B. An input 21 to the phase correlator 11 is the electrical response 20 of the microphone 7B after being digitized by a first A/D converter 8B. This input 21 is a digitized representation of the acoustic waves from speakers 5 (FIG. 1) plus background noise as detected by the microphone 7B. A second input 22 to the phase correlator is a signal from an audio amplifier 4B after being digitized by a second A/D converter 10B.

Figure 3:
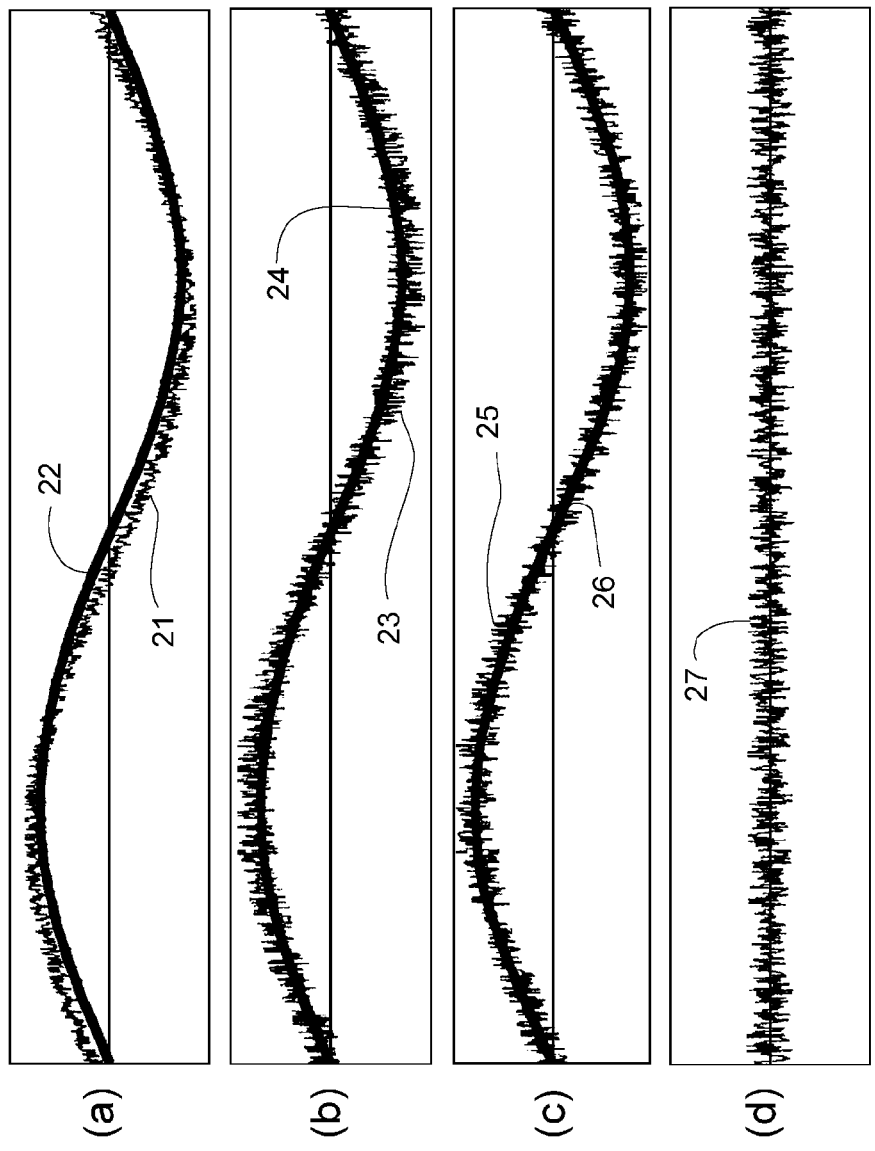
FIGS. 3(a) through 3(d) are exemplary representations of an audio amplifier signal and a corresponding AVC microphone signal at certain stages of processing according to this invention.

The correlators, 11 and 12, and the signal subtraction process 13 cooperate to separate the sound of the speakers from the background noise so that the background noise can be processed separately. The correlators correlate the digitized inputs, 21 and 22, from the two A/Ds, 8B and 10B, so that they can be subtracted from each other by the signal subtraction process 13 with the remainder being the background noise, as illustrated by FIGS. 3(a) through 3(d). FIG. 3(a) illustrates an exemplary cycle of signals at the outputs, 21 and 22, of the A/Ds comprising the digitized microphone signal and audio amplifier signal, respectively. FIG. 3(b) illustrates an exemplary cycle of signals at the outputs, 23 and 24, of the phase correlator 11. FIG. 3(c) illustrates an exemplary cycle of signals at the outputs, 25 and 26, of the amplitude correlator 12. FIG. 3(d) illustrates an exemplary cycle of a signal at the output 27 of the signal subtractor 13.

It might be possible, using factory settings, to subtract the inputs 21 and 22 directly without first correlating them, but the tolerance for jitter between the inputs 21 and 22 is so demanding that over time the system characteristics may drift and detune. Components 11 and 12 can correlate the inputs 21 and 22 continuously in near real time, if necessary, or only at each start-up of the audio device, if such is sufficient. Both the phase and amplitude can be correlated with respect to inputs 21 and 22 over multiple processing periods for greater accuracy.

Referring again to FIG. 2, the phase correlator 11 precedes the amplitude correlator 12. The phase correlator calculates the correlation function of the digitized signals, 21 and 22, with respect to phase difference (over a limited range around the factory-set value of zero), and adjusts the relative phase of 21 and 22 to the maximum of the correlation function. The phase-correlated signals, 23 and 24, corresponding respectively to 21 and 22, are then sent to the amplitude correlator 12 as inputs. The amplitude correlator calculates the correlation function of input 24 and the difference of inputs 23 and 24 with respect to the gain of input 24 (over a limited range around the factory-set value of one), and adjusts the gain of input 24 to the minimum of the correlation function. The signals 23 and 24 are then sent to the signal subtraction process 13 as the phase- and amplitude-correlated signals 25 and 26, respectively. The signal subtraction module 13 receives the two phase- and amplitude-correlated signals and subtracts them to produce a difference signal 27 that is communicated as an input to the FFT module 14. The difference signal 27 is the best representation of the noise background after the sound from the speakers 5 has been subtracted.

The operating characteristics of a preferred embodiment of an FFT module 14 can be best described as follows. Let the sampling rate of the A/D converters 8B and 10B be s samples/second. Let the number of samples to be processed in each processing period of the FFT module be N, where N must be an integer-power of 2. Then each processing period is N/s, and the time from receiving the first sample to the last in each processing period is $$T=(N-1)/s. \tag{1}$$

The frequency resolution of the Fourier transform is $$\Delta f=1/T=s/(N-1). \tag{2}$$

The highest frequency component of the Fourier transform is $$f_m=N\Delta f/2=[N/(N-1)]s/2. \tag{3}$$

In the preferred embodiment the FFT module described below is particularly well suited to calculating the preferred speech interference level (PSIL) from the noise background. The PSIL is the arithmetic average of the noise levels in the three octave bands centered at 500, 1000, and 2000 Hz, that is, the three octave bands from 354 to 707 Hz, from 707 to 1414 Hz, and from 1414 to 2828 Hz, respectively.

The following design guidelines are preferred for an accurate calculation of the PSIL:

(a) The frequency resolution of the Fourier transform should be finer than about 40 Hz, that is, $$\Delta f = s/(N-1) \leq 40 \text{ Hz}, \quad (4)$$

in order to get good statistics on the noise level by having at least of the order of 10 frequency components, even in the lowest octave band.

(b) The processing period of the FFT module should be no longer than about 25 ms, that is, $$T = (N-1)/s \leq 25 \text{ ms}, \quad (5)$$

in order to provide at least of the order of 10 PSIL calculations to the solver 17 every quarter second or so. A quarter second is less than or about the time over which the AVC should begin to respond to a rapidly changing noise background.

(c) The highest frequency component of the Fourier transform should be at least about 2800 Hz, that is, $$f_m = [N/(N-1)]s/2 \geq 2800 \text{ Hz}, \quad (6)$$

in order to get good statistics on the noise level in the highest octave band by populating it fully.

Combining these design guidelines, Equations (4)-(6), leads to the following point design as an example of an FFT module that is particularly well suited to calculating the PSIL for an AVC: $N=128$; $s=5600$ Hz; $T=22.7$ ms; $\Delta f=44.1$ Hz; $f_m=2822$ Hz.

After each processing period, the FFT module 14 sends a signal as an input 28 to the bandpass filters 15, the signal comprising an amplitude for each of the frequency components of the FFT spectrum. With the point design in the preferred embodiment, the FFT calculates 65 amplitudes each processing period for the frequency components $f_j = j\Delta f = j(44.1 \text{ Hz})$, where $j=0, 1, 2, \ldots, 64$. In the preferred embodiment, the 8 frequency components, $f_9=397$ Hz through $f_{16}=706$ Hz, populate the lowest octave of the PSIL. The 16 frequency components, $f_{17}=750$ Hz through $f_{32}=1411$ Hz, populate the middle octave of the PSIL. The 32 frequency components, $f_{33}=1455$ Hz through $f_{64}=2822$ Hz, populate the highest octave of the PSIL.

The bandpass filters 15 pass only those frequency components within bands 29 that are used by the speech-interference noise level (SIL) calculator 16. In the preferred embodiment as described above, in which 16 calculates the PSIL, the bands 29 include the 56 frequency components from $f_9$ through $f_{64}$. The SIL calculator 16 calculates the arithmetic average (in dB) of the noise levels in the three (octave) frequency bands 29 passed by the filters 15 and sends as an input 30 to the solver 17 a single PSIL value (in dB) every processing period ($N/s=22.9$ ms in the preferred embodiment).

The solver 17 calculates a gain control signal 19, subject to certain constraints 32 to be sent to the audio amplifier 4B every processing period. The purpose of the solver 17 is to calculate a gain control signal 19 that responds proportionately to changing noise levels of a duration sufficient to interfere with intelligibility of speech or appreciation of music, and that responds negligibly to fluctuations of noise levels at the processing cycle frequency, $s/N$, or to brief noise transients. The response of the gain control signal 19 must be somewhat dilatory to allow the solver 17 to distinguish SIL changes of significant duration from insignificant transients. But it should not be so dilatory as to seem to the listener to be unresponsive to substantial changes of SIL.

In the preferred embodiment, the model used for the solver 17 is that of a driven damped harmonic oscillator. The gain control signal 19 (in dB), a(t), as a function of time t satisfies the second-order differential equation, $$a''(t) + b\omega_0 a'(t) + \omega_0^2 a(t) = \omega_0^2 [S(t) + R_0], \quad (7)$$

where a prime denotes a derivative with respect to time, b is a damping constant, $\omega_0$ is a constant frequency indicative of the 'stiffness' of the response, S(t) is the SIL (in dB), and $R_0$ is the listener's preferred signal-to-SIL ratio (in dB). ($R_0$ is one of the constraints 32 imposed on the solver 17 by user interaction through the manual volume control 6.)

In terms of a normalized gain control signal, $A(t) \equiv a(t) - R_0$, Equation (7) may be written as $$A''(t) + b\omega_0 A'(t) + \omega_0^2 [A(t) - S(t)] = 0. \quad (8)$$

For the ith processing cycle, this model is implemented in the solver 17 by the following algorithm:

$$A_{i+1}' = A_i' + (N/s)A_i''; \quad (9a)$$

$$\text{if } |A_i - S_1| \geq r_0, \text{ then } A_{i+1} = A_i + (N/s)A_i'; \quad (9b)$$

$$\text{otherwise } A_{i+1}'' = A_i; \quad (9c)$$

$$A_{i+1}'' = \omega_0^2 S_{i+1} - b\omega_0 A_{i+1}' - \omega_0^2 A_{i+1}; \quad (9d)$$

$$\text{if } A_{i+1} \leq A_{min}, \text{ then } A_{i+1} = A_{min}. \quad (9e)$$

The constant $r_0$ (in dB) is a threshold difference of the normalized gain control signal, A(t), from the SIL, S(t), below which the gain control signal remains unchanged. The constant $A_{min}$ (in dB) is the user-preferred floor of the normalized gain control signal, A(t).

The constant $r_0$ is intended to desensitize the algorithm to most of the high-frequency fluctuations of the SIL in an otherwise constant noise background, and to keep A(t) constant in such an environment. A typical factory setting for $r_0$ might be about 1 dB. The constant $r_0$ could also be made adaptive by making it proportional to the root-mean-square fluctuation of the SIL, for example, at the cost of additional processing.

The constant $A_{min}$ is the listener's preferred minimum normalized gain control signal, which is generally independent of how quiet the environment may become. The listener establishes or re-establishes $A_{min}$ through the manual volume control 6 by adjusting the volume higher in quiet environments.

The initial conditions for the algorithm in Equations (9) at system start-up (t=0), or whenever the user establishes new constraints 32 through the manual volume control 6 (FIG. 1) are: $A_0 = S_0$, $A_0' = 0$, $A_0'' = 0$.

Figure 4:
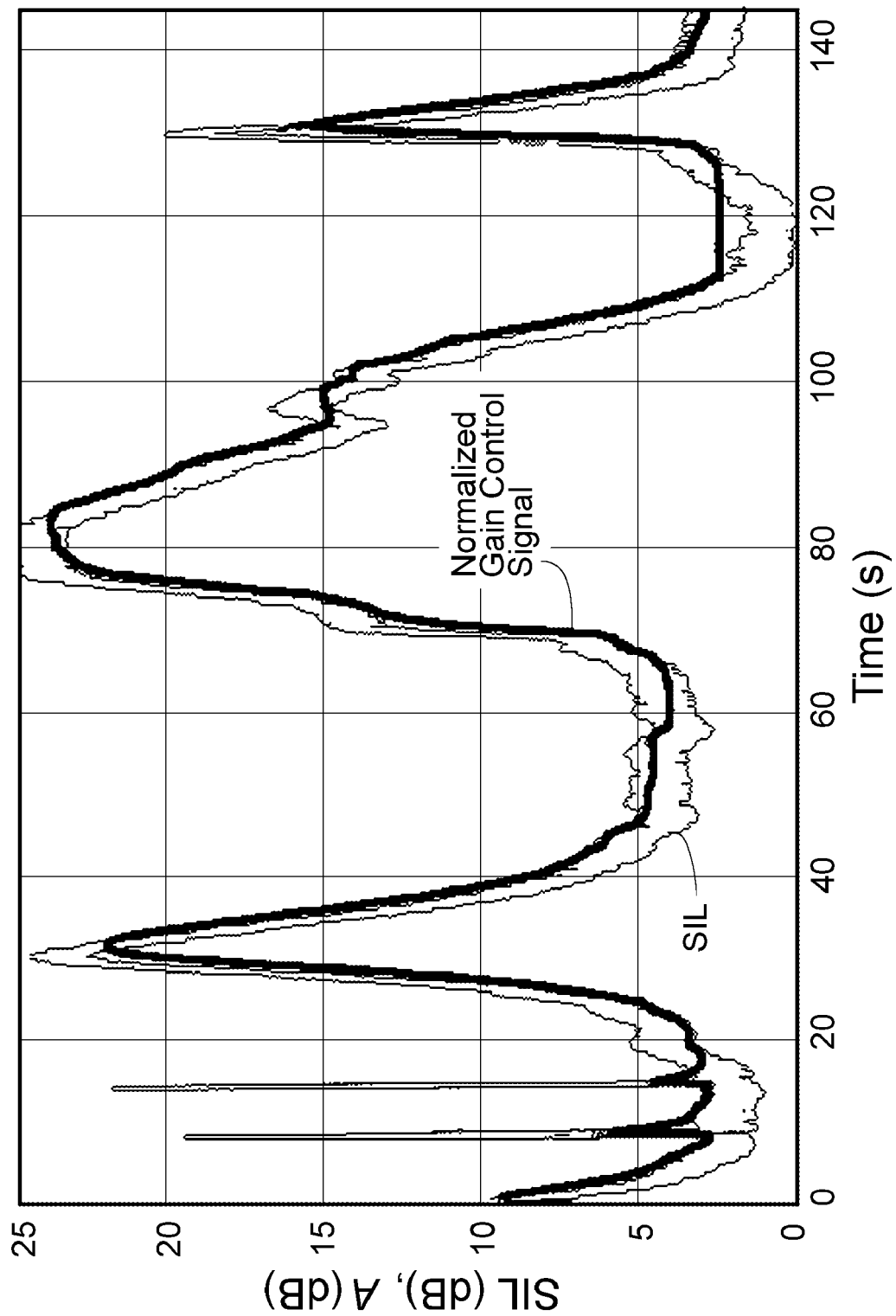
FIG. 4 illustrates exemplary representations of speech interference noise level (SIL) over a time period and a corresponding normalized gain control signal (A) that is produced over the same time period by a preferred embodiment of this invention.

FIG. 4 shows the result of implementing the algorithm of Equations (9) on a simulated SIL. The envelope marked SIL represents SIL noise (in dB) as a function of time (in seconds) with significant changes of various durations and with random high-frequency fluctuations up to ±1 dB. The simulated SIL includes two transient triangular noise spikes, each 100 times (20 dB) louder than the background. For this simulation, the processing period, N/s, was taken to be 22.7 ms, as in the example above. The following values of constants were used in implementing the algorithm, Equations (9), in FIG. 4: $\omega_0 = 8 \text{s}^{-1}$, $b=4$, $r_{00}=1$ dB, $A_{min}=2.5$ dB. FIG. 4 also shows that the algorithm, Equations (9), for the normalized gain control signal 19, the solid black curve, responds as desired to the SIL. After a brief delay, A(t) responds fully to long-duration changes in the SIL. A(t) is virtually oblivious to high-frequency fluctuations. To the half-second noise spike at t=8 s and the quarter-second noise spike at t=14 s, both 100 times louder than the background, the response of A(t) is a few dB for no more than about one second. Lastly, the normalized gain control signal does not fall below the user-preferred floor of $A_{min}$=2.5 dB.

Constraints 18 are applied as inputs 32 to the solver 17. Generally, it is preferable to apply at least two constraints: (1) $R_0$, the listener's preferred signal-to-SIL ratio (in dB); and (2) $A_{min}$, the listener's preferred floor for the normalized gain control signal (in dB). There are many variations of algorithms for providing these and other constraints 32 from the constraint module 18. One example follows.

Any time the manual volume control 6 is adjusted (including at start-up of the audio device in FIG. 1), a new value of $R_0$ is calculated by module 18 and sent as an input to the solver 17. The new value of $R_0$ is the difference between the gain control signal a(t) at the end of each manual volume adjustment (or at start-up) and some weighted average of SILs calculated for the same time. For example, let the processing period during which the manual adjustment ends be denoted by the subscript m, and let the weighted average be over m processing periods. An example of an algorithm for calculating $R_0$ is $$R_0 = a(t_m) - \frac{1}{m}\sum_{i=1}^{m} w_i SIL_i, \quad (10)$$

where $w_i$ is a normalized weighting function. An example of a normalized weighting function that weights SILs in processing periods near the end of an adjustment more heavily is $w_1=2i/(m+1)$. A typical time for calculating a weighted average of SILs might be about a quarter second, or about 11 processing periods in the example given above.

Any time a weighted average of SILs is below some threshold value $SIL_t$, and the manual volume control 6 is adjusted upward, a new value of $A_{min}$ is calculated by module 18 and sent as an input to the solver 17. (The threshold $SIL_t$ may be, for example, the lowest weighted average of SILs since start-up that did not prompt a manual volume adjustment during some latency period.) The new value of $A_{min}$ is the normalized gain control signal established manually by the end of each such adjustment. When these conditions are met for establishing a new $A_{min}$, a new $R_0$ is not also calculated. That is, if $A_{min}$ is changed by a manual volume adjustment, $R_0$ remains unchanged by that adjustment.

Any further manual volume adjustments establish new values of $A_{min}$ and $R_0$, in accordance with the same algorithms.

The foregoing description and drawings were given for illustrative purposes only, it being understood that the invention is not limited to the embodiments disclosed, but is intended to embrace any and all alternatives, equivalents, modifications and rearrangements of elements falling within the scope of the invention as defined by the following claims.

I claim:

1. For an audio amplifier having a manual volume control, which provides an audio signal to one or more speakers, an automatic volume control to compensate for speech interference noise comprising:
 a) a microphone for detecting acoustic waves emanating from the one or more speakers and background noise, and in response for producing a corresponding signal;
 b) a phase correlator process for phase correlating the microphone and amplifier signals;
 c) an amplitude correlator process for amplitude correlating the phase correlated microphone and amplifier signals;
 d) a subtraction process for producing a signal corresponding to a difference between the phase and amplitude correlated microphone and amplifier signals;
 e) a transform process for producing over a period of time a signal corresponding to the amplitude of each frequency component of the difference signal within the spectrum of said transform process;
 f) a bandpass filter process for filtering the transform process produced signal to pass only those frequency components within selected bands;
 g) a speech interference noise level calculation process for receiving the bandpass filtered frequency components and responsive to produce a signal corresponding to a combination of the amplitudes of the bandpass filtered frequency components; and
 h) a solver process for receiving the combined amplitudes of the bandpass filtered frequency components and responsive to produce according to an algorithm a signal for controlling the gain of the audio amplifier;
 i) a constraint process for receiving input from the manual volume control and responsive to produce according to an algorithm a signal constraining the gain control signal.

2. The automatic volume control according to claim 1 wherein the selected bands include the three octave bands centered at 500, 1000 and 2000 Hz.

3. The automatic volume control according to claim 1 wherein the transform process comprises a fast Fourier transform module.

4. The automatic volume control according to claim 3 wherein:
 a) the frequency resolution of the fast Fourier transform is less than 100 Hz;
 b) the processing period of the fast Fourier transform is less than 100 ms; and
 c) the highest frequency component of the fast Fourier transform is at least 2000 Hz.

5. The automatic volume control according to claim 3 wherein:
 a) the number of samples processed by the fast Fourier transform module in each processing period is 128;
 b) the sampling rate is 5600 Hz;
 c) the frequency resolution of the fast Fourier transform is 44.1 Hz;
 d) the processing period of the fast Fourier transform is 22.7 ms; and
 e) the highest frequency component of the fast Fourier transform is 2822 Hz.

6. The automatic volume control according to claim 1 further comprising a constraint process for producing a signal to constrain according to an algorithm the gain control signal from the solver process.

7. The automatic volume control according to claim 1 wherein the solver process produces a gain control signal that proportionally corresponds only to changes in the calculated speech interference noise level that are of sufficient duration to affect a listener's perception of the aforesaid acoustic waves emanating from the one or more speakers.

8. The automatic volume control according to claim 1 wherein the algorithm performed by the solver process is that of a driven damped harmonic oscillator with constraints.

9. The automatic volume control according to claim 1 wherein the algorithm performed by the solver process produces a gain control signal, a(t), as a function of time t according to the second-order differential equation $a''(t)+b\omega_0 a'(t)+\omega_0^2 a(t)=\omega_0^2[S(t)+R_0]$ wherein a prime denotes a derivative with respect to time, b is a damping constant, $\omega_0$ is a constant frequency indicative of the stiffness of the response, S(t) is a speech interference noise level, and $R_0$ is a listener's preferred signal-to-speech-interference-noise level ratio.

10. The automatic volume control according to claim 9 wherein $R_0$ is selected by listener interaction through a manual volume control.

11. The automatic volume control according to claim 10 wherein the algorithm performed by the solver process produces a gain control signal, A(t), as a function of time t according to the second-order differential equation $A''(t)+b\omega_0 A'(t)+\omega_0^2[A(t)-S(t)]=0$ wherein A(t) is a normalized gain control signal and $A(t) \equiv a(t)-R_0$.

12. The automatic volume control according to claim 11 wherein for an ith processing cycle: $A_{i+1}'=A_i'+(N/s)A_i''$; if $|A_i-S_i| \geq r_0$, then $A_{i+1}=A_i+(N/s)A_i'$, otherwise $A_{i+1}=A_i$; $A_{i+1}''=\omega_0^2 S_{i+1}-b\omega_0 A_{i+1}'-\omega_0^2 A_{i+1}$; if $A_{i+1} \leq A_{min}$, then $A_{i+1}=A_{min}$; wherein $r_0$ is a threshold difference of the normalized gain control signal A(t) from the speech interference level S(t), below which the gain control signal remains unchanged, and the constant $A_{min}$ is a listener-preferred floor of the normalized gain control signal established by the listener through adjusting a manual volume control.

13. The automatic volume control according to claim 12 wherein $A_{min}$ is selected by listener interaction through a manual volume control.

14. The automatic volume control according to claim 1 further comprising:
 a) a digitizer for digitizing the microphone signal;
 b) a digitizer for digitizing the audio signal; and
 c) wherein some of the processes are performed by a digital signal processor.

15. The automatic volume control according to claim 1 wherein the combination of amplitudes of the bandpass filtered frequency components is an arithmetic average of the noise levels in each of the selected bands.

16. For an audio amplifier having a manual volume control, which provides an audio signal to one or more speakers, a method for automatically controlling volume to compensate for speech interference noise comprising the steps:
 a) transducing acoustic waves emanating from the one or more speakers and background noise into a corresponding signal;
 b) correlating the phases of the transduced and audio amplifier signals;
 c) correlating the amplitudes of the phase correlated transduced and audio amplifier signals;
 d) producing a signal corresponding to a difference between the phase and amplitude correlated transduced and audio amplifier signals;
 e) transforming the difference signal over a period of time to produce a signal corresponding to the amplitude of each frequency component within a transform spectrum;
 f) filtering the signal corresponding to the amplitude of each frequency component and passing only those frequency components within selected bands;
 g) calculating a speech interference noise level that is a combination of the amplitudes of the bandpass filtered frequency components; and
 h) using the speech interference noise level in an algorithm to produce a signal for controlling the gain of the audio amplifier;
 i) using inputs from the manual volume control in an algorithm for constraining the gain control signal.

17. The method control according to claim 16 wherein the combination of amplitudes of the bandpass filtered frequency components is an arithmetic average of the noise levels in each of the selected bands.

18. The method control according to claim 16 wherein the selected bands include the three octave bands centered at 500, 1000 and 2000 Hz.

19. The method control according to claim 16 further comprising the step of transforming the difference signal over a period of time to produce a signal corresponding to the amplitude of each frequency component within a transform spectrum by means of a fast Fourier transform module.

20. The method control according to claim 19 wherein:
 a) the frequency resolution of the fast Fourier transform is less than 100 Hz;
 b) the processing period of the fast Fourier transform is less than 100 ms; and
 c) the highest frequency component of the fast Fourier transform is at least 2000 Hz.

21. The method control according to claim 19 wherein:
 a) the number of samples processed by the fast Fourier transform module in each processing period is 128;
 b) the sampling rate is 5600 Hz;
 c) the frequency resolution of the fast Fourier transform is 44.1 Hz;
 d) the processing period of the fast Fourier transform is 22.7 ms; and
 e) the highest frequency component of the fast Fourier transform is 2822 Hz.

22. The method control according to claim 16 further comprising the step of producing a signal to constrain according to an algorithm the signal for controlling the gain of the audio amplifier.

23. The automatic volume control according to claim 16 further comprising the step of producing a gain control signal that proportionally corresponds only to changes in the calculated speech interference noise level that are of sufficient duration to interfere, from a listener's perspective, with the aforesaid acoustic waves emanating from the one or more speakers.

24. The method control according to claim 16 wherein the algorithm of step (h) is that of a driven damped harmonic oscillator with constraints.

25. The method control according to claim 16 further comprising the step of producing a gain control signal, a(t), as a function of time t according to the second-order differential equation $a''(t)+b\omega_0 a'(t)+\omega_0^2 a(t)=\omega_0^2[S(t)+R_0]$ wherein a prime denotes a derivative with respect to time, b is a damping constant, $\omega_0$ is a constant frequency indicative of the stiffness of the response, S(t) is a speech interference noise level, and $R_0$ is a listener's preferred signal-to-speech-interference-noise level ratio.

26. The method control according to claim 25 wherein $R_0$ is selected by listener interaction through a manual volume control.

27. The method control according to claim 26 wherein the algorithm produces a gain control signal, A(t), as a function of time t according to the second-order differential equation $A''(t)+b\omega_0 A'(t)+\omega_0^2[A(t)-S(t)]=0$ wherein A(t) is a normalized gain control signal and $A(t) \equiv a(t)-R_0$.

28. The method control according to claim 27 wherein for an ith processing cycle: $A_{i+1}' = A_i' + (N/s)A_i'$; if $|A_i - S_i| \geq r_0$, then $A_{i+1} = A_i + (n/s)A_i'$, otherwise $A_{i+1} = A_i$; $A_{i+1}'' = \omega_0^2 S_{i+1} - b\omega_0 A_{i+1}' - \omega_0^2 A_{i+1}$; if $A_{i+1} \leq A_{min}$, then $A_{i+1} = A_{min}$; wherein $r_0$ is a threshold difference of the normalized gain control signal $A(t)$ from the speech interference level $S(t)$, below which the gain control signal remains unchanged, and the constant $A_{min}$ is a listener-preferred floor of the normalized gain control signal established by the listener through adjusting a manual volume control.

29. The method control according to claim 28 wherein $A_{min}$ is selected by listener interaction through a manual volume control.

* * * * *